US008615754B2

(12) United States Patent
Reid

(10) Patent No.: US 8,615,754 B2
(45) Date of Patent: Dec. 24, 2013

(54) COMPUTER-IMPLEMENTED METHOD AND EXECUTABLE PROGRAM FOR UPDATING REFERENCE DATA

(75) Inventor: William R. R. Reid, Edinburg (GB)

(73) Assignee: Compagnie Industrielle et Financiere D'Ingenierie, "Ingenico", Neuilly sur Seine (FR)

( * ) Notice: Subject to any disclaimer, the term of this patent is extended or adjusted under 35 U.S.C. 154(b) by 1090 days.

(21) Appl. No.: 12/034,151

(22) Filed: Feb. 20, 2008

(65) Prior Publication Data
US 2008/0222193 A1    Sep. 11, 2008

(30) Foreign Application Priority Data

Feb. 23, 2007   (EP) ..................................... 07290240

(51) Int. Cl.
G06F 9/44       (2006.01)

(52) U.S. Cl.
USPC ............ 717/171; 717/168; 717/169; 713/187

(58) Field of Classification Search
USPC .......................................... 717/118, 168–178
See application file for complete search history.

(56) References Cited

U.S. PATENT DOCUMENTS

| | | | | |
|---|---|---|---|---|
| 5,050,075 | A | * | 9/1991 | Herman et al. ........................ 1/1 |
| 5,884,071 | A | * | 3/1999 | Kosaraju ........................ 712/245 |
| 5,892,960 | A | * | 4/1999 | Seide ................................. 712/7 |
| 7,287,185 | B2 | * | 10/2007 | Safford et al. ................... 714/11 |
| 2002/0057446 | A1 | * | 5/2002 | Long et al. .................... 358/1.13 |
| 2003/0212712 | A1 | * | 11/2003 | Gu et al. ......................... 707/200 |
| 2004/0062130 | A1 | * | 4/2004 | Chiang ..................... 365/230.03 |
| 2004/0215593 | A1 | * | 10/2004 | Sharangpani et al. ............ 707/1 |
| 2007/0101104 | A1 | * | 5/2007 | Diefendorff ................... 712/225 |

OTHER PUBLICATIONS

XP002443257 (Randal C. Burns, Darrell D. E. Long) "In Place Reconstruction of Delta Compressed Files", 1989.
XP002443258 (Anonymous) "Using Binary Delta Compression (BDC) Technology to Update Windows Operating Systems", Oct. 6, 2005.
XP002443259 (Anonymous) "RFC 3284—The VCDIFF Generic Differencing and Compression Data Format", Jun. 2006.
XP002443260 (Anonymous) "Chapter Five Instruction Set architecture", Jan. 13, 2007.
XP002443261 (Anonymous) "Microcode", Dec. 16, 2006.

* cited by examiner

Primary Examiner — Lewis A Bullock, Jr.
Assistant Examiner — Tina Huynh
(74) Attorney, Agent, or Firm — Westman, Champlin & Koehler, P.A.; David D. Brush

(57) ABSTRACT

A computer-implemented method is provided for updating reference data. The method includes a step of providing update data structured according to a given data structure. The data structure has at least two streams of data, wherein one of the streams includes patterns of instructions to a processor, and at least one other stream includes patterns of operands of the instructions. The operands and the instructions are designed for updating the reference data upon processing the update data at a processor. Also, a computer executable program code is provided, which is stored in a computer readable medium or in a signal, suitable for implementation of the method. Further, a terminal (e.g. a payment terminal or electronic funds transfer at point of sale) is provided, which includes a memory with the program code stored thereon.

18 Claims, 5 Drawing Sheets

| 30 | 0f | 39 | 01 | 06 | fc | 61 | 1b | 01 | fd | 35 | 58 | fd | 02 | 95 | fa |
| 27 | fe | 02 | fb | f5 | 02 | 2c | fb | 16 | fd | 02 | 55 | fd | 02 | 10 | fe |
| 02 | b0 | f9 | 02 | 1c | 12 | fd | 02 | 20 | fe | 02 | 50 | f9 | 02 | 2a | 04 |
| f1 | 5d | 32 | 20 | 09 | 40 | ba | ec | bd | 9e | 9e | 20 | 29 | cb | b7 | 90 |
| e7 | 30 | 12 | 14 | 47 | 03 | 99 | f4 | 1a | 9f | 30 | ba | b2 | 64 | fe | b7 |
| 87 | ce | de | 03 | 1f | 41 | d0 | a3 | e1 | 1d | ab | 52 | d6 | c9 | 7d | dd |
| 65 | 1c | 11 | d5 | eb | 24 | d6 | 89 | f6 | b3 | 43 | 3d | f0 | 4e | 33 | 59 |
| 66 | 6b | 8f | 62 | f0 | 82 | f2 | 40 | 1f | f5 | 38 | 70 | ce | cc | 33 | a9 |
| 99 | 59 | 64 | 97 | cd | c6 | 57 | 2f | 6d | 6c | 2c | 74 | aa | 48 | ae | cc |
| 7e | dc | 04 | 43 | e9 | 41 | 93 | 4d | e5 | 64 | 9f | 2e | c3 | 0c | f2 | 8a |
| 69 | f7 | fc | e3 | a2 | 70 | d8 | fb | 19 | 38 | 7a | ff | 6d | e7 | 51 | d9 |
| 14 | 17 | b2 | 34 | 1e | 06 | e6 | 3b | be | f5 | bf | 0c | ee | b2 | ed | 15 |
| c1 | b2 | 29 | 8f | 30 | | | | | | | | | | | |

COMPUTER-IMPLEMENTED METHOD AND EXECUTABLE PROGRAM FOR UPDATING REFERENCE DATA

CROSS-REFERENCE TO RELATED APPLICATIONS

None.

FIELD OF THE DISCLOSURE

The disclosure relates to the field of computer programs and systems, and more specifically to a computer-implemented method for updating data, e.g. data related to embedded softwares.

BACKGROUND OF THE DISCLOSURE

In computer science, a data file is a computer file which stores data for use by a computer application or system. A data file may use a specific data structure. A data structure is a way of storing data in a computer memory such that it can be used efficiently e.g. by the computer's central processing unit (CPU). As a result, a data structure may impact the functioning of the computer's CPU. Data structures may be implemented using e.g. data types, references and operations on them provided by a programming language. Common data structures are e.g. lists, arrays, linked list, graph data structures, etc. (see e.g. Wikipedia contributors, "Data structure,").

A data file does generally not refer to files that contain instructions or code to be executed (typically called program files), or to files, which define the operation or structure of an application or system (which include configuration files, directory files, etc.); but more specifically to information used as input, and/or written as output by some other software program. In the following, a data file will however be understood as a computer file which may store both instructions and data for use by the CPU (for a detailed discussion on data file, see e.g. Wikipedia contributors, "Data file,").

Besides, machine code or machine language is known to be a system of instructions and data directly understandable by a computer's CPU. Instructions are encoded as patterns of bits with different patterns corresponding to different commands to the machine. Every CPU model has its own machine code, or instruction set. There is usually a substantial overlap between the various machine codes in use. Some machine languages give all their instructions the same number of bits, while the instruction length differs in others. How the patterns are organized depends on the specification of the machine code. Common to most is the division of one field (the opcode) which specifies the exact operation (for example "add"). Other fields may give the type of the operands, their location, or their value directly.

More in details, an opcode (the term is an abbreviation of Operation Code) is the portion of a machine language instruction that specifies the operation to be performed. Their specification and format will be laid out in the instruction set architecture (ISA) of the computer hardware component in question, which is e.g. a CPU or a more specialized unit. A complete machine language instruction contains an opcode and, optionally, the specification of one or more operands, that is, what data the operation should act upon. Some operations have implicit operands or none. Some ISAs have instructions with defined fields for opcodes and operands, while others have a more complicated structure.

The operands upon which opcodes operate may consist of registers, values in memory, values stored on the stack, I/O ports, the bus, etc., depending on the CPU architecture. The operations an opcode may specify can include e.g. arithmetic, data copying, logical operations, and program control.

Opcodes can also be found in byte codes interpreted by a byte code interpreter (or virtual machine, in one sense of that term). In these, an instruction set architecture is created to be interpreted by software, rather than a hardware device. Often, byte code interpreters work with higher-level data types and operations than a hardware instruction set, but are constructed along similar lines. Examples include the Java programming language's Java Virtual Machine (JVM), the byte code used in GNU Emacs for compiled LISP code, and many others (see e.g. Wikipedia, "Machine code," "Opcode,").

Opcodes shall hereafter denote some low-level instructions to a processor.

Aspects of compression and "Delta" or "Deltafile" technology are now discussed. According to Wikipedia, Delta encoding is a way of storing or transmitting data in the form of differences between sequential data rather than complete files. Delta encoding is sometimes called Delta compression, particularly where archival histories of changes are required (e.g., in software projects).

The differences are recorded in discrete files called "Deltas" or "diffs", after the Unix file comparison utility, "diff". Because changes are often small (typically 2% total size on average), Delta encoding greatly reduces data redundancy. Collections of unique Deltas are substantially more space-efficient than their non-encoded equivalents.

Perhaps the simplest example is storing values of bytes as differences (Deltas) between sequential values, rather than the values themselves. So, instead of 2, 4, 6, 9, 7, one would store 2, 2, 2, 3, −2. This is not very useful when used alone, but it can help further compression of data in which sequential values occur often. Compression algorithms often choose to Delta encode only when the compression is better than without. For example, in video compression Delta frames can considerably reduce frame size, and are used in a number of video compression codec.

A Deltafile can be defined in two ways, a symmetric Delta or a directed Delta. A symmetric Delta between two versions v1 and v2 consists of properties specific to both v1 and v2 (v1\v2 and v2\v1). A directed Delta, also called a change, is a sequence of (elementary) change operations which, when applied to one version v1, yields another version v2.

The nature of the data to be encoded influences the effectiveness of a particular compression algorithm. Delta encoding performs best when data has small or constant variation; for an unsorted data set, there may be little to no compression possible with this method.

Thus, Delta technology is a way of creating new versions by reusing old versions and this, by exploiting their likely similarity. It is worth mentioning that the primary purpose of a Delta Language is to binary-encode differences between reference data or "ancestor" (e.g. the "old" version of a file, typically a binary file) and updated data or "descendant" (e.g. the "new" binary version of the file) in a highly compressed manner.

There are many ways of compressing computer information prior to transmission but in these days of hundred's of megabytes of memory and multi gigahertz processors, there are none aimed specifically at the embedded market where both memory and clock-cycles are typically in short supply. Additionally, the embedded market has simultaneously embraced advanced compiler technology combined with compact processors with correspondingly difficult-to-compress instruction sets. The result is that embedded software updates (by remote download) are taking longer because the software is growing in size faster than the typical bandwidth available. A new approach of updating data is therefore required for embedded systems. Said approach should preferably be convenient for systems, which combine the sophistication of Delta technology with a small memory footprint and relatively low-cycle processor that we find on today's embedded systems.

There are many Delta algorithms available (some of which are free). However, on examination and evaluation, such algorithms were found to exhibit unsatisfactory performance and/or use too much memory, at least for some specific practical implementation such as update of embedded softwares.

Accordingly, there is a need for a new computer-implemented method for updating data, which improves performance and/or needs less memory compared with known methods.

SUMMARY

An aspect of the present disclosure relates to a computer-implemented method for updating reference data, comprising a step of providing update data structured according to a given data structure, said data structure comprising several streams of logically partitioned data. "Update data" are the data, which are needed for updating the reference data. A data file representing update data will be hereafter referred to as the "Deltafile".

The update data are partitioned according to similarities, as predicted by the present inventor. Thanks to the partitioning scheme of the streams, data in one of the streams have more similarity, whereby an improved subsequent compression can be achieved. More in details, the data structure comprises e.g. at least two streams of data, wherein:
  one of the stream comprises patterns of instructions to a processor; and
  at least one other stream comprises patterns of operands of the instructions, and wherein the operands and the instructions are designed for allowing the reference data to be updated upon processing said update data at a processor.

The multi-stream file format makes the data structure very compressible by an external algorithm (e.g. the LZ77 algorithm), owing to the increased similarity of data.

Such a method nicely combines with a new Delta algorithm which turns very suitable for embedded systems. This algorithm will be described below. The data structured as evoked above can be regarded as a result of implementing said new Delta algorithm, wherein the data are logically partitioned according to a multi-stream data format.

Typically, said instructions are opcodes and the operands notably comprise byte values of changes of the reference data to be performed according to the opcodes. Such a partition makes the update data well suited for updating embedded softwares such as softwares used by payment terminal.

More generally, the present disclosure proposes various features aiming notably at increasing data similarity in the update data, e.g. in each stream thereof, so that better compression can be achieved.

For example, the above data structure comprises at least three streams of data, wherein:
  a stream comprises patterns of opcodes;
  another stream comprises patterns of first payload byte of changes in the reference data to be performed according to one or more of the opcode; and
  still another stream comprises patterns of subsequent payload bytes, if any, of changes of the reference data to be performed according to one or more of the opcode.

The reason for choosing such a partitioning scheme arises from a new detailed investigation of the basic structure of the changes occurring in a typical Deltafile, e.g. in the field of embedded software updates. From this investigation, it was concluded that: the first payload byte of a change has a high probability of being similar to the first payload byte of another change. Otherwise said, first payload bytes of all changes are more similar to each other than the remaining payload bytes of all changes. Accordingly, the data structure proposed above increases the similarity of data in practice, whereby better compressibility is subsequently achieved.

Preferably, some of the operands of the opcodes might be included in the stream corresponding to opcodes. In particular, the stream comprising the opcodes may further comprise relative addresses of where byte values of change have to be performed, e.g. in the updated data (descendant). In fact, inspection of typical Deltafile shows that most changes between ancestor and descendant are concentrated into relatively small areas in the descendant. In other words the "distance" between the addresses of one change and the next in the descendant is usually small (difference is usually under 16 bytes, which can be encoded in 4-bits). Said addresses are thus advantageously coded as differences from the last descendant address. Implementing addresses for opcodes as differences from the last descendant address allows in practice to save at least one byte per use.

Preferably also, said opcodes may comprise: at least one opcode designed for single-byte changes; and opcodes designed for multi-byte change. Such a separation makes that at least one opcode is specifically dedicated to 1-byte changes. This is convenient since, in practice, 1-byte changes account for nearly one half of the payload of data bytes in the Deltafile.

As said opcode is thus likely to be often involved, it is advantageous to make it an implicit opcode, which allows for making a Deltafile smaller. In practice, making it completely implicit saves one byte per byte-change.

Preferably also, the opcodes are encoded in 4-bits (thus, a grammar composed of only seventeen different opcodes can be contemplated, including the implicit opcode). This allows for improving performances too since most changes involve changing a very small number of bytes, usually under sixteen (which can thus be encoded in 4 bits).

As to the opcodes, in an embodiment, one of the opcodes can be a forced base-page change opcode, designed for incrementing a current base-page in the updated data. Note that implementing addresses for Delta opcodes as differences has the effect of making the necessity of using such an opcode extremely rare (e.g. 2 bytes per 100,000 bytes of Delta opcodes and payload typically). Thus, implementing said opcode together with relative addresses turns very advantageous.

Preferably, at least one of the opcodes is an inheritance opcode. This arises due to the fact that there are usually common second-order (and potentially "long-range") repeating change patterns in many cases, e.g. like change the 1st, 9th, 75th, 87th and 94th bytes from several fixed addresses. Now, this may opcode-up as two or more repeating and identical sequences (especially in case of code jump-tables or branch instructions) because inheritance opcodes can then be used. A complementary compression algorithm then properly compresses these sequences. Details about inheritance opcodes (as well as about the LZ77 algorithm) can be found in "The Data Compression Book", 2nd edition, by Mark Nelson and Jean-Loup Gailly, M&T Books, New York, N.Y.

1995. Although making use of inheritance opcodes may turn advantageous for some applications, this is not at all mandatory.

In an embodiment, the method may further comprise additional steps of:
- compressing the provided update data, possibly at the same time as the step of providing;
- transmitting the compressed update data to the processor;
- decompressing at the processor the compressed update data;
- interpreting at the processor the decompressed update data; and
- updating the reference data by the processor, according to the interpreted update data, whereby efficient update of a reference data is achieved.

In addition, the update data may be initially provided in one file only, resulting in a more compact update process.

An aspect of the disclosure is further directed to a computer executable program code stored in a computer readable medium or in a signal, suitable for implementation of the method disclosed herein.

An aspect of the disclosure is also directed to a terminal (e.g. a payment terminal or electronic funds transfer at point of sale) comprising a memory with said program stored thereon.

Thus, as explained above, the Delta multi-stream data format makes the Deltafile itself very compressible (by a second algorithm). In contrast, most if not all compression and Delta algorithms have a single compressed stream (plus the reference data or ancestor stream for Delta), which is then converted, to a single output stream. Here, the Delta Algorithm uses two, three or more parallel input streams for the Deltafile plus one more for the reference data (ancestor) stream. This increase of input streams improves final compression by more than ten percents. One reason also that this is so successful is that the Delta Algorithm allows the complementary compression algorithm to compress repeating and "second order" update patterns, which would not be visible to the complementary compression algorithm normally.

In addition, it is proposed (see the preferred embodiment discussed below) an instruction set with preferred grammar and syntax rules which allows extremely efficient encoding of the most common changes (e.g. branch instructions, jump-tables, inserting code blocks, deleting code blocks etc).

In an implementation, the new Delta Algorithm underlying the present disclosure (hereafter called Delta algorithm) outperformed every other Delta algorithm tested but required only 10 Kbytes of code storage and 18 Kbytes of RAM. Of this 10 Kbytes of code, 7 Kbytes were dedicated to a complementary compression algorithm (here LZ77) and only 3 Kbytes were required to implement the embedded component of the Delta algorithm. Of the 18 Kbytes of RAM, 10 Kbytes were required to implement the embedded "end" of the Algorithm.

The foregoing has outlined rather broadly the features and advantages of aspects of the present disclosure in order that the detailed description that follows may be better understood. Additional features and advantages will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying drawings. It is to be expressly understood, however, that the drawings are provided for the purpose of illustration and description only and is not intended as a definition of the limits of the present invention.

BRIEF DESCRIPTION OF THE DRAWINGS

For a more complete understanding of the present disclosure, reference is now made to the following description of a preferred embodiment, taken in conjunction with the accompanying drawings, in which

FIG. 3 is a representation of an example of an uncompressed update data file (or Deltafile), structured according to an aspect of the present disclosure;

FIG. 4 is a representation of the update data of FIG. 3 from the reference data ("ancestor") Point-of-view; and FIG. 5 is a representation of the update data of FIG. 3 from the updated data ("descendant") Point-of-view.

DETAILED DESCRIPTION OF ILLUSTRATIVE EMBODIMENTS

1. Concepts of the Present Disclosure 1.1. Main Aspects—Description of FIG. 1 and FIG. 2

Figure 1:
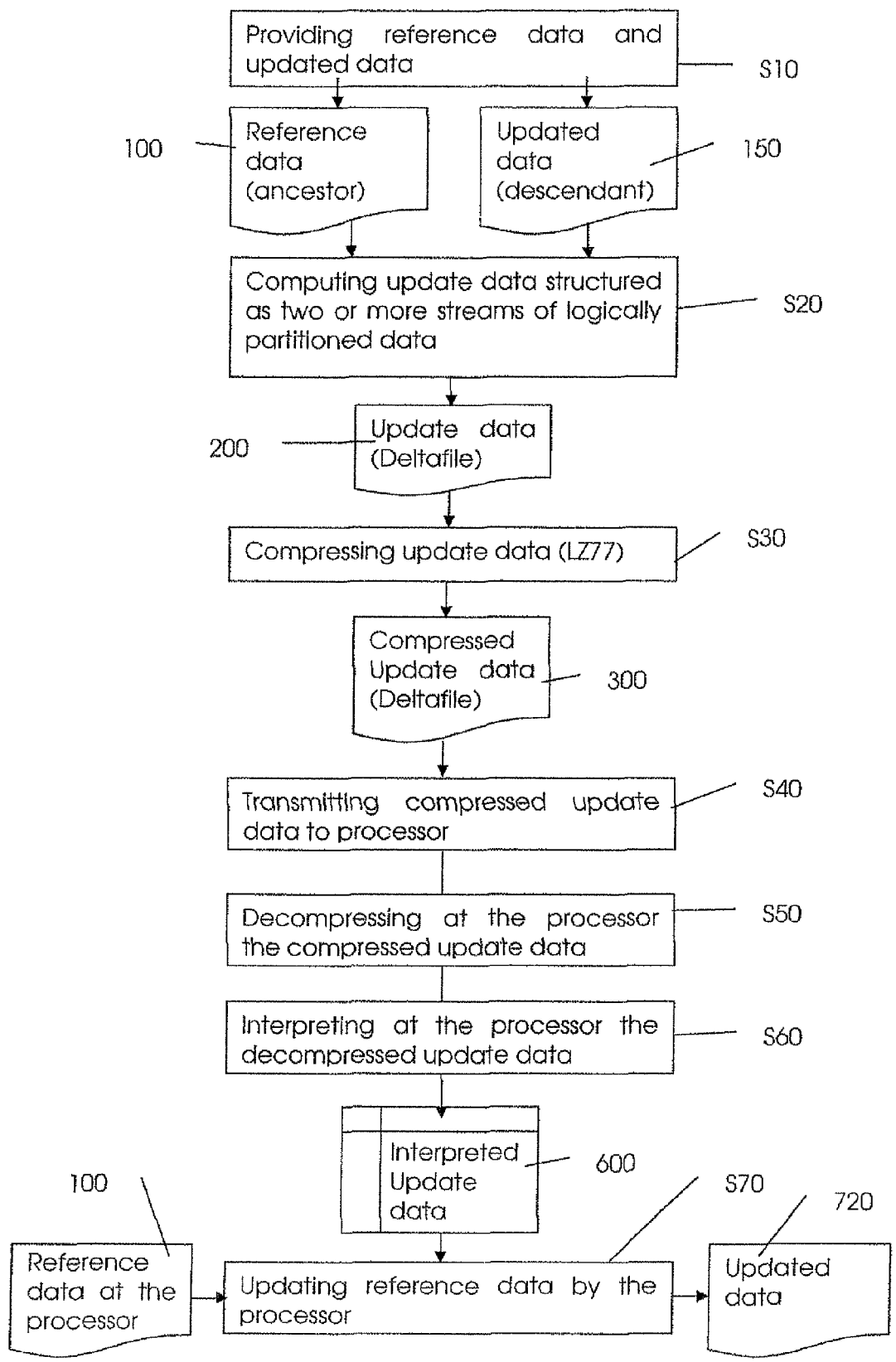
FIG. 1 is a flowchart representing steps of the method according to one aspect of the present disclosure.

In reference to FIG. 1, the method according to the present disclosure may, in an embodiment, comprise a number of steps as shown in FIG. 1. The flowchart actually illustrates a complete scenario of using update data to update reference data.

First, from a provided (step S10) set of reference or ancestor data 100 and update or descendant data 150, update data (hereafter Deltafile) is computed (step S20).

According to the present disclosure, the data structure of said Deltafile comprises at least two streams, or preferably three streams of data, as will be discussed below in reference to FIG. 2.

Then, descending the flowchart of FIG. 1, the method may further comprise a step of compressing (step S30) the Deltafile 200 provided. Then, the compressed Deltafile might be transmitted (step S40) to the processor.

Next, the compressed Deltafile is decompressed (step S50) at the processor.

Upon decompression or after, the processor will interpret (step S60) the decompressed Deltafile in order to update (step S70) the reference data 100, according to the interpreted Deltafile 600.

This allows for efficiently updating e.g. an application loaded in a terminal, for example a payment terminal.

Figure 2:
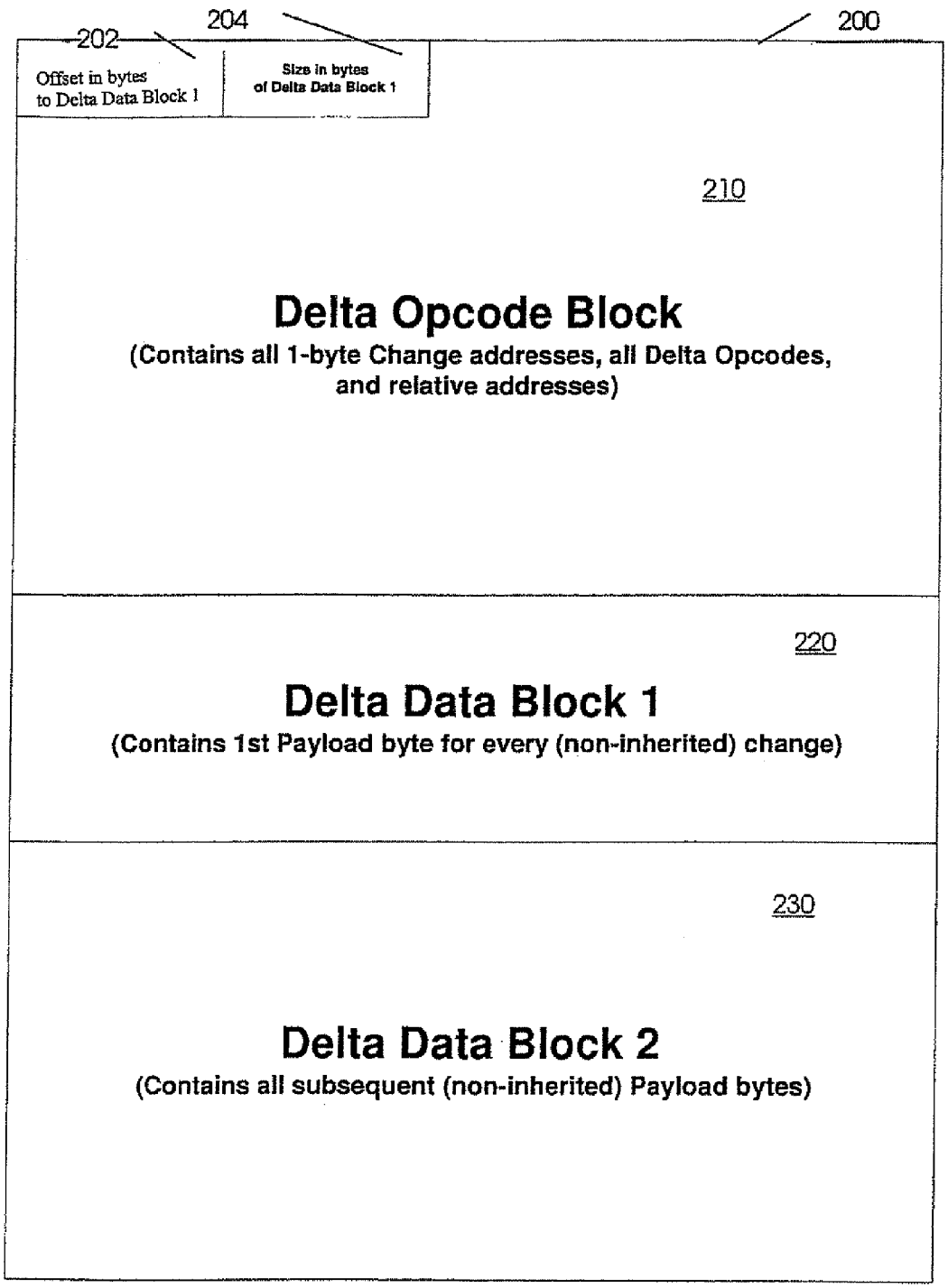
FIG. 2 shows a schematic file of update data, structured according to an embodiment.

In reference now to FIG. 2, one of the streams 210 of the Deltafile comprises patterns of opcodes, that is, instructions to a processor. Other streams 220, 230 comprise patterns of operands of the instructions. The operands in question comprise byte values of change of the reference data to be performed according to the opcodes, as described above. In an embodiment, a second stream 220 comprises patterns of first payload byte of changes of the reference data to be performed, while a third one 230 has patterns of subsequent payload bytes of changes to be performed, as explained above.

As indicated in FIG. 2, the (unique) opcode stream 210 further comprises addresses of where changes have to be performed, each address being a relative address coded as the difference from the last address of change in the updated data (descendant). The operands and the opcodes are designed for making it possible to update the reference data 100 upon processing the Deltafile 300, 600 at the processor, e.g. the processor of the payment terminal.

As visible also in FIG. 2, two variable length fields 202, 204 at the start of the file allow the start position of the Opcode block 210 to be implicit (it is the sum of the two values). For instance, when the code block pointer 1 "crosses" the data block pointer 1 (referred to as 220), then the execution of the Deltafile is complete. No explicit "End of Deltafile" marker/Opcode is therefore required.

In addition, putting all initial payload bytes together into one block improves subsequent compression by a complementary algorithm (e.g. via a complementary algorithm like LZ77).

Furthermore, putting all relative addresses into the Opcode block (following the Opcode or standalone) improves subsequent compression by the complementary algorithm.

Finally, eliminating inherited payload immediately (from blocks 1 and 2, referred to as 220 and 230) improves compression before subsequent compression by the complementary algorithm.

These and other features of the Deltafile will be described in details in the following sections. Such features relate to a very specific embodiment. Obviously, other embodiments could be contemplated by the skilled person based on one or more of the features of the invention which are disclosed in the appended claims and already discussed above.

1.2. Axioms

Investigation of compression and Deltafiles led the inventor to a number of observations, some of which have already been discussed above. Said observations are listed hereafter.

1. Most changes between ancestor and descendant are concentrated into relatively small areas in the descendant. In other words the "distance" between the addresses of one change and the next in the descendant is usually small (difference is usually under 16 bytes, which can be encoded in 4-bits).

2. Most changes involve changing a very small number of bytes, usually under 16 (which can be encoded in 4 bits).

3. 1-byte changes account for nearly one half of the payload of data bytes in the Deltafile.

4. 2-byte changes account for nearly one quarter of the remaining payload of data bytes in the Deltafile.

5. Block changes over 2 bytes are usually less than 128 bytes long (this can be encoded in a single variable-length byte). Such changes are commonly under 16 bytes (and so can be encoded in 4-bits).

6. The first payload byte of all changes are more similar to each other than the remaining payload bytes of all changes.

7. The second and subsequent payload bytes of all changes are more similar to each other than the first payload byte of all changes.

8. There are common second-order (and potentially "long-range") repeating change patterns in many Delta cases, like changing the 1st, 9th, 75th, 87th and 94th bytes from several fixed addresses. As discussed, this may opcode-up as two or more repeating and identical sequences, especially in case of code jump-tables or branch instructions as inheritance opcodes can be used. A complementary compression algorithm may then properly compress the sequences.

9. Delta opcodes compress better (using the complementary algorithm) alongside other Delta opcodes than with ancestor/descendant code.

10. ancestor/descendant code compress better (using the complementary algorithm) alongside ancestor/descendant code than with Delta opcodes.

11. ancestor/descendant binaries are not very compressible (say 50% or 2:1) with the complementary algorithm on its own.

The above observations led the inventor to design a number of the features discussed hereafter.

1.3 Delta Change Types

According to the present embodiment, the Deltafile format comprises e.g. two types of information, that is:
  ADDRESSES that identify which memory contents between ancestor and descendant must change; and
  PAYLOAD VALUES, which identify what BYTE-VALUES the changes should be.

In the present embodiment, there are three basic types of Delta operations:
  1) Single-byte change.
  There are two variants of single-byte change:
    a) Single byte relative address/byte value replacement pairs
    b) Single byte relative address/inherited byte value replacement
  2) Multi-byte change.
  There are six variants of multi-byte change:
    a) 2-byte inherited value replacement.
    b) 3-byte inherited value replacement.
    c) n-byte multi-byte replacement.
    d) ancestor multi-byte-deletion.
    e) Multi-byte append.
    f) Multi-byte replacement.
  3) Forced base-page change (no data is altered by this opcode).

The forced base-page is ensured thanks to an opcode which explicitly increments the current implicit base-page by the parameter value.

There is also a variable-length format used throughout the present language as a sequence of bytes where one more byte is implied to be included in length value if the current byte has the most significant bit set. Hence, instead of a fixed-length variable (e.g. 8-bit, 16-bit, etc) which implies a maximum representable value, variable-length format allows an unlimited value to be represented by a series of 8-bit bytes. In each 8-bit byte, there is 7-bit of data, with the most-significant bit indicating whether another byte will follow (1=followed by another byte, 0=last byte). Format is Big Endian. This format means that any length can be represented efficiently. This variable-length format is known in the art.

1.4 Delta Grammar

Before introducing the opcodes explicitly, let mention that use is here made of two basic forms of Deltafile instructions. Using notations usual in the art, these are:
  1) [INC_BASE n]<relative address> <single-byte payload value>
  2) <Instruction opcode>[INC_BASE n]<relative address> <rest of opcode block>

Here the square brackets [ . . . ] are optional.

All addresses used here for Delta are relative offset (unsigned) addresses to the last change made and are only 8 bits long. This means that if the change is more than 256 bytes away from the last change then the "INC_BASE n" instruction must preferably be placed immediately before the address to indicate the number of complete 256-byte pages that should be passed from ancestor to descendant before the remaining <address>bytes are passed through also.

The format of the presently used addresses is a single-byte wherein the base-page for which that single-byte is an offset from the previous absolute address (least significant byte) is implicit. For example:

Absolute Address (Implicit Base-page×
256)+<address>+<last_abs_addr_lsb>

Incidentally, there is one way of explicitly changing base-page but more importantly (from a compression point-of-view) there is the implicit base-page change where the implicit base-page increments by one if the <last_abs_addr_lsb> is greater than the current (<address>+<last_abs_addr_lsb>) and if no explicit base-change opcode (i.e. INC_BASE) has just been encountered immediately before the <address> field.

Remembering the first of the above axioms, one understands that implementing addresses for Delta opcodes as differences from the last descendant address written allows for saving at least one byte per use. Furthermore, as already evoked, implementing addresses for Delta opcodes as differences has the effect of making the necessity of using the opcode INC_BASE extremely rare (e.g. 2 bytes per 100,000 bytes of Delta opcodes and payload typically).

1.5 Delta Opcodes (0xf0→0xff)

In the present embodiment, one of the opcodes is designed for a single-byte change "(CHANGE_BYTE)" and is an implicit opcode. Opcodes are generally encoded in 4-bits, so that seventeen different opcodes can be contemplated, including the implicit opcode. Such a number of opcodes is a convenient compromise in a 4-bit encoding context. In addition, some of the following opcodes can be optimized, as will be described later.

The opcodes in question have the following syntax:

1.5.1. (CHANGE_BYTE)<Relative Address> <Single-Byte Value>

This opcode changes 1 byte at a relative address, e.g. <address>+<last_abs_addr_lsb>, with <data byte>. This is a virtual opcode, which is not actually planted by the Deltafile compiler because it is the default opcode assumed before the next opcode is actually read from the Deltafile. If an alternative opcode is detected then it overwrites this assumption with the opcode just read. When the 1-byte change is made, the difference between the ancestor and descendant byte value is carried forward at run-time for possible "inherited" use later on by the DELTA_CH_1_INH opcode as <last ancestor 1-byte offset>. Also when two consecutive (CHANGE_BYTE) "instructions" are detected, the two-byte value (in X-Endian format, see an explanation below as to X-Endian format) is carried forward at run-time for possible "inherited" use by the three opcodes DELTA_CH_2_INH, DELTA_CH_2_INH2 and DELTA_CH_2_INH3. As said, making the opcode CHANGE_BYTE completely implicit saves one byte per byte-change (see axiom #3).

1.5.2. DELTA_CH_1_INH (==0xf0)<relative address>

This opcode changes 1 byte at address <address>+<last_abs_addr_lsb> using <last ancestor 1-byte offset>. This is a "real" opcode, which is equivalent to the (virtual) CHANGE_BYTE opcode. This opcode does not have a data byte payload but instead calculates it at run-time by using the last byte offset from the original ancestor byte used in the last CHANGE_BYTE opcode with the latest ancestor byte. This makes "inherited" 1-byte changes more compressible by making 1-byte changes more similar to each other while not actually saving any uncompressed Deltafile space. This opcode is targeted against updating branch instructions.

Recalling axioms #6, 9, 10 and 11, one concludes that the explicit opcode DELTA_CH_1_INH creates a more-compressible change than the opcode CHANGE_BYTE.

1.5.3. DELTA_CH_2_INH (==0xf1)<Relative Address>

This opcode changes two bytes at address <address>+<last_abs_addr_lsb> using <last ancestor 16-bit data word offset>. Thus, this opcode changes two ancestor bytes (expressed as a X-Endian 16-bit value) using (one of) the ancestor offsets of the last three detected 2-byte changes. This opcode does not have a 2-byte data byte payload but instead calculates the two bytes to use at run-time by using (one of) the last 2-byte offsets from the original ancestor bytes (also expressed as a X-Endian 16-bit value) used in the last two consecutive CHANGE_BYTE opcodes with the latest ancestor 2-byte value (again in X-Endian format). This both makes "inherited" 2-byte changes more compressible by making 2-byte changes more similar to each other and also saves 2-bytes payload per use. This opcode is equivalent to the opcodes DELTA_CH_2_INH2 and DELTA_CH_2_INH3. All three opcodes represent a "cache" of three 16-bit X-Endian offsets populated at run-time. This opcode is targeted against updating branch instructions.

The explicit opcodes DELTA_CH_2_INHx creates a more-compressible change than two consecutive (CHANGE_BYTE) implicit opcodes because of the use of a 3-way cache of the last 2-byte changes. Furthermore, the opcode trio (that is, DELTA_CH_2_INH, DELTA_CH_2_INH2, and DELTA_CH_2_INH3) always saves two bytes of payload per use.

1.5.4. DELTA_CH_2_INH2 (==0xf2)<Relative Address>

This opcode is equivalent to DELTA_CH_2_INH and DELTA_CH_2_INH3.

1.5.5. DELTA_CH_2_INH3 (==0xf3)<Relative Address>

This opcode is equivalent to DELTA_CH_2_INH and DELTA_CH_2_INH2.

1.5.6. DELTA_CH_3_INH (==0xf4)<relative address>

In the same spirit, this opcode is designed to change three bytes at address <address>+<last_abs_addr_lsb> using <last ancestor 24-bit data word offset>. The explicit opcode DELTA_CH_3_INH creates a more-compressible change than three consecutive (CHANGE_BYTE) implicit opcodes because of use of a 1-way cache of the last 3-byte change.

1.5.7. DELTA_DELETE (==0xf5)<Relative Address> <Variable-Length>

This will delete next <variable-length> bytes from the ancestor from a relative address. The explicit opcode DELTA_DELETE is especially important when axiom #1 and 2 above do not permit substitution of the DELTA_DELETE_COMP opcode instead.

1.5.8. DELTA_APPEND (==0xf6)<Relative Address> <Variable-Length>[Variable-Length Data Bytes]

This adds <v-length> number of bytes from the Deltafile from relative address. Similarly, the explicit opcode DELTA_APPEND is especially important when substitution of the DELTA_APPEND_COMP opcode is not permitted.

1.5.9. DELTA_CHANGE (==0xf7)<Relative Address> <Variable-Length>[Variable-Length Data Bytes]

This replaces next <variable-length> number of bytes of the ancestor from the Deltafile from relative address. This turns important when substitution of the DELTA_CHANGE_COMP is not permitted.

1.5.10. DELTA_CH_DELETE (==0xf8)<Relative Address> <Variable-Length1> <Variable-Length2>[Variable-Length1 Data Bytes]

This opcode replaces next (<variable-length1>+<variable-length2>) number of bytes of the ancestor with the next <variable-length1> bytes from the Deltafile (i.e. an implicit deletion of data) from a relative address. This opcodes turns advantageous when substitution of the DELTA_CH_DELETE_COMP opcode is not permitted.

1.5.11. DELTA_CH_APPEND (==0xf9)<Relative Address> <Variable-Length1> <Variable-Length2>[Variable-Length1 Data Bytes]

This replaces next <variable-length2> number of bytes of the ancestor with the next <variable-length1> bytes from the Deltafile (that is, an implicit addition of data) from the relative address. This is advantageously implemented when substitution of the DELTA_CH_APPEND_COMP opcode is not permitted.

1.5.12. DELTA_DELETE_COMP (==0xfa)<4-Bit Relative Address 14-Bit Length>

It is processed similarly as DELTA_DELETE <address> <length>. This opcode is one of the optimised (optional) opcodes, which is used when axiom #1 and 2 apply.

1.5.13. DELTA_APPEND_COMP (==0xfb)<4-Bit Relative Address 14-Bit Length>[Length Data Bytes]

This opcode is processed similarly as DELTA_APPEND <address> <length>[length data bytes] and is one of the optimised (optional) opcodes, which is used when axiom #1 and 2 apply.

1.5.14. DELTA_CHANGE_COMP (==0xfc)<4-Bit Relative Address 14-Bit Length>[Length Data Bytes]

This opcode is processed similarly as DELTA_CHANGE <address> <length>[length data bytes] and is one of the optimised (optional) opcodes, which is used when axiom #1 and 2 apply.

1.5.15. DELTA_CH_DELETE_COMP (==0xfd)<Relative Address> <4-Bit Length1|4-Bit Length2>[Length1 Data Bytes]

This opcode is processed similarly as DELTA_CH_DELETE <address> <msn length> <lsn length>[msn length data bytes] and is one of the optimised (optional) opcodes, which is used when axiom #2 apply.

1.5.16. DELTA_CH_APPEND_COMP (==0xfe)<Relative Address> <4-bit Length1|4-Bit Length2>[Length1 Data Bytes]

This opcode is processed similarly as DELTA_CH_APPEND <address> <msn length> <lsn length>[msn length data bytes] and is one of the optimised (optional) opcodes, which is used when axiom #2 apply.

1.5.17. INC_BASE (==0xff)<Variable-Length>

This opcode increments the current base page by the parameter <variable-length>. If <variable-length> is zero then this is merely an escape code to avoid confusing an address byte with an opcode.

This opcode INC_BASE might be especially useful when:

1. A base-change (i.e. a 256-byte page of the descendant) is required but is not implicit because (usually) the base-change must be incremented by more than 1.

2. A base-change is implied (but should not be) and thus gives rise to planting an INC_BASE 0 instruction in order to prevent this implication.

As said, there are sixteen explicit opcodes (0xf0→0xff). In contrast, single-byte changes are not allocated an opcode as they are usually the most numerous and are therefore more advantageously encoded implicitly. For example, if an opcode is not found (e.g. 0xf0→0xff) then a CHANGE_BYTE opcode is implied.

In the cases where two lengths can be "compressed" into 1 byte (e.g. DELTA_CH_DELETE_COMP and DELTA_CH_APPEND_COMP), the most-significant nibble is the "msn" (upper 4 bits) and the least-significant nibble is the "lsn" (lower 4 bits).

As to the X-endian format: all "inheritance" opcodes (for example DELTA_CH_*_INH*) are either Little endian or Big endian. This depends directly on the "endian" dictated by the embedded processor. If one is using terminals which are Little endian, then all the "inheritance" opcodes will be implemented as Little endian. For a Big endian implementation these instructions would be converted to Big endian equivalents. To cover both these possibilities the term "X-endian" is used here to mean either Little endian or Big endian, depending on the central processor design.

All of the above opcodes (apart from CHANGE_BYTE which is a "virtual" opcode) fit inside a single 4-bit nibble and are combined with a 4-bit ESCAPE_NIBBLE constant to form a single-byte. ESCAPE_NIBBLE is the fixed upper nibble (4-bit) of all explicit opcodes, i.e. the 'f' part of 0xf0 to 0xff. The lower nibble, from 0 to f, is enough to represent 16 explicit opcodes. The fixed upper nibble allows for an opcode being distinguished from other type of data. A reason for choosing 'f' in the upper nibble is the following. The valid Deltafile opcode range has been set from 0xf0 to 0xff inclusive (i.e. the highest unsigned 8-bit values) to avoid as much as possible a clash with an address offset from a single-byte change. In addition, INC_BASE has been set to the highest unsigned value (i.e. 0xff) so that there is a minimal chance that any opcode address offset will clash with INC_BASE (which would however be the only clash possible with opcodes addresses, in the preferred embodiment).

The opcodes from 0xf5 to 0xf9 (inclusive) plus 0xff (INC_BASE) plus the virtual opcode CHANGE_BYTE form a consistent set of instructions to represent any difference between any two binaries. The remaining opcodes are optimised opcodes which save at least one byte each and were derived from analysing ancestor and descendant binaries.

Obviously, other definitions of opcodes could be designed. Accordingly, the invention could be implemented with opcodes other than those discussed above. Yet, it could be contemplated implementing the invention with any one or more of the above opcodes. In particular, one may contemplate an embodiment wherein in particular both INC_BASE and CHANGE_BYTE opcodes are involved (the latter being preferably implicit). Obviously, the above disclosure allows for contemplating a language based on any combinations of the above opcodes, using possibly the grammar discussed above.

1.6 Delta Optimisation Hierarchy

As said, some of the above opcodes can be optimised. In order to optimize the instruction set to appear in a Delafile, use will be made of optimization rules. A number of optimization possibilities may be contemplated, in view of the presently used instructions and grammar.

For example, one may try applying the following instruction replacement: (INC_BASE 1)←INC_BASE 1

In other words, one tries replacing an explicit "INC_BASE 1" instruction with an implicit "INC_BASE 1", where the grammar rules permit it. Basically, this allows for saving two bytes per optimisation performed.

Other replacements can be contemplated by the skilled person. For example, one may try replacing DELTA_DELETE_COMP←DELTA_DELETE This may be performed when the relative address and length can both be encoded in 4-bits. This saves at least one byte per optimisation.

As another example, one may try replacing
DELETA_APPEND_COMP←DELTA_APPEND
Such a replacement occurs when the relative address and length can both be encoded in 4-bits. This saves at least 1 byte per optimisation.

Still other optimization possibilities can be contemplated, for example: DELTA_CH_x_INHy←DELTA_CHANGE_COMP←DELTA_CHANGE←(CHANGE_BYTE), which is for instance implemented as a three step process; DELTA_CH_DELETE_COMP←DELTA_CH_DELETE; or DELTA_CH_APPEND_COMP←DELTA_CH_APPEND.

2. Examples

2.1 Simple Examples

Simple examples are now given to better understand the data structure and its operation. Keeping in mind the syntaxes of the opcodes described above, one understands that the instruction (CHANGE_BYTE) 0x24 0x56 actually stores 0x24 in the Delta Opcode Block (reference 210) and 0x56 in Delta Data Block 1 (reference 220).

As another example, the instruction DELTA_CHANGE 0x24 0x04 0x01 0x02 0x03 0x04 would actually store DELTA_CHANGE and 0x24 and 0x04 in the Delta Opcode Block (reference 210) while 0x01 would be stored in Delta Data Block 1 (reference 220) and 0x02, 0x03, and 0x04 would be stored in Delta Data Block 2 (reference 230).

The layout of the Deltafile means that the Opcode and Payload will be read from different parts of the file rather than reading them sequentially. This improves compression because Payload and Opcode are unlikely to resemble each other and so are not positioned together for achieving better compression.

Figure 4:
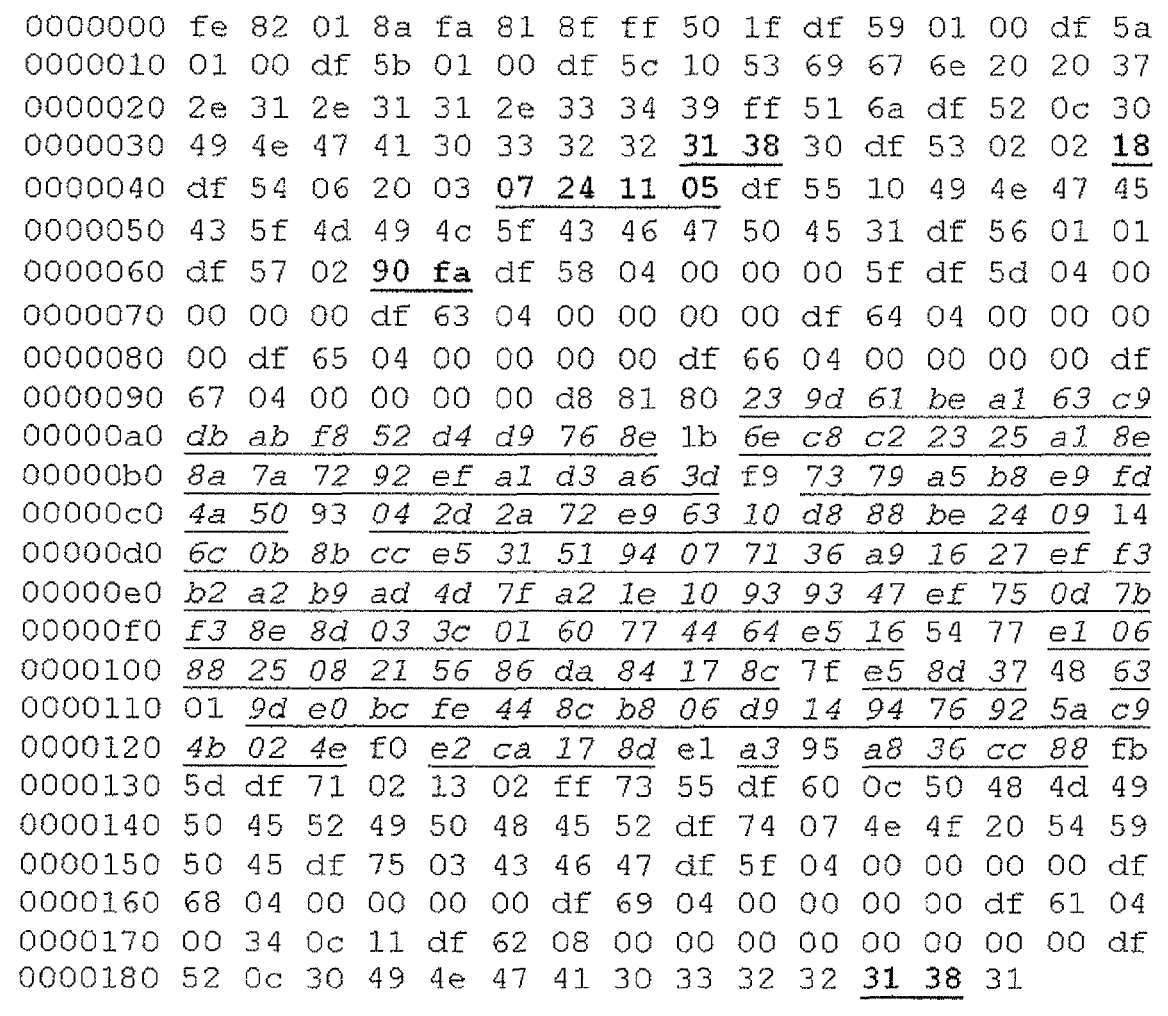
Figure 5:
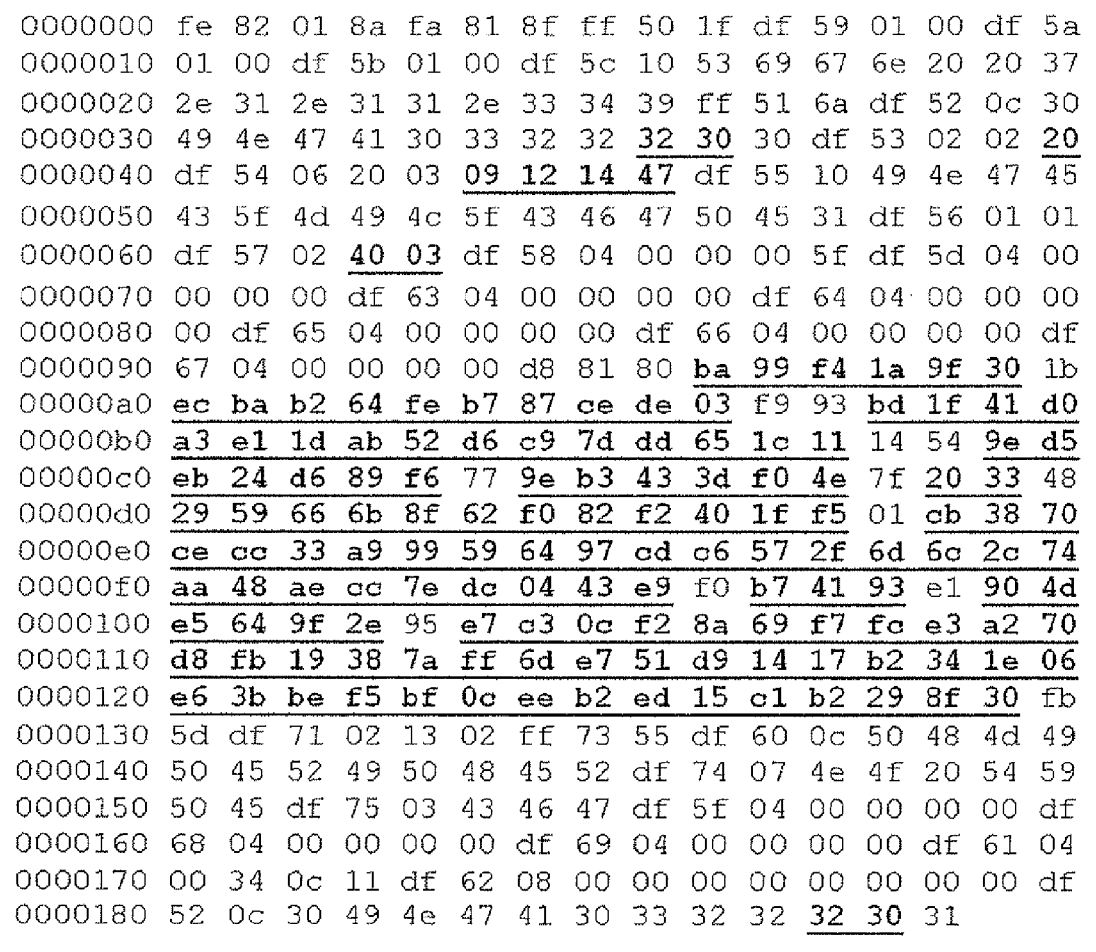

2.2 Example of Deltafile Hexdump—FIG. 3-5

For the sake of completeness, let us give an explicit representation of a Deltafile according to the present disclosure. FIG. 3 gives such a representation. More in details, FIG. 3 shows an example of an uncompressed Deltafile hexdump.

In the example of FIG. 3, characters which are bold and underlined correspond to Deltafile Code, while italic characters correspond to Deltafile Data (i.e. Payload). The multi streamed data structure is clearly apparent in the Deltafile.

FIG. 4 shows a representation of the Deltafile of FIG. 3 but now from the ancestor point-of-view. Here the bold and underlined bytes correspond to bytes to be changed for the descendant. Italics and underlined bytes denote bytes to be deleted (i.e. to be ignored). Finally, the other bytes are bytes to be inherited by the descendant.

FIG. 5 shows the update data of FIG. 3 but now from the descendant Point-of-view. At present the bold and underlined bytes correspond to databyte payload from the Deltafile, while all other bytes denote bytes inherited from the ancestor.

Obviously, it should be kept in mind that the example of FIG. 3-5 would result in a poor compression (when integrated with a complementary compression algorithm) for the following reasons:
the corresponding ancestor and descendant binaries are very small in this example.
ancestor and descendant do not resemble each other very well from a binary point of view; and
ancestor and descendant are not "running" binaries here—they are essentially constant data files.

Although the present disclosure has been described with reference to one or more examples, workers skilled in the art will recognize that changes may be made in form and detail without departing from the scope of the disclosure and/or the appended claims.

What is claimed is:

1. A method implemented by a terminal for updating reference data stored in memory of the terminal, the method comprising a step of:
providing update data structured according to a partitioned data structure, wherein:
the data structure comprises first, second and third partitioned streams of data, wherein:
the first stream, named an opcode stream, comprises patterns of instructions to a processor, wherein the instructions are opcodes and wherein the opcode stream further comprises addresses of where changes have to be performed in said reference data, each address being a relative address coded as the difference from a last address of change in the update data;
the second stream comprises patterns of operands of the instructions, comprising a first payload byte of changes of the reference data to be performed, wherein the operands comprise byte values of changes of the reference data to be performed according to the opcodes; and
the third stream comprises patterns of subsequent payload bytes of changes to be performed, and
the operands and the instructions are designed for updating the reference data upon processing the update data at a processor;
compressing the provided update data;
transmitting the compressed update data to the processor;
decompressing at the processor the compressed update data; and
interpreting at the processor the decompressed update data and updating the reference data by the processor, according to the interpreted update data.

2. The method according to claim 1, wherein said opcodes comprise:
at least one opcode designed for single-byte changes; and
opcodes designed for multi-byte change.

3. The method according to claim 2, wherein:
opcodes are encoded in 4-bits.

4. The method according to claim 2, wherein:
said at least one opcode designed for single-byte changes is an implicit opcode.

5. The method according to claim 1, wherein:
one of the opcodes is a forced base-page change opcode, designed for incrementing a current base-page.

6. The method according to claim 1, wherein:
at least one of the opcodes is an inheritance opcode.

7. The method according to claim 1, wherein:
the opcodes comprise seventeen different opcodes, including an implicit opcode.

8. The method according to claim 1, wherein said update data are provided in one file.

9. A computer executable program code stored on a non-transitory computer readable medium, suitable for implementation of a method for updating reference data stored in a memory of a terminal, the method comprising:
providing update data structured according to a partitioned data structure, wherein:
the first stream, named an opcode stream, comprises patterns of instructions to a processor, wherein the instructions are opcodes and wherein the opcode stream further comprises addresses of where changes have to be performed in said reference data, each address being a relative address coded as the difference from a last address of change in the update data;

the second stream comprises patterns of operands of the instructions, comprising a first payload byte of changes of the reference data to be performed, wherein the operands comprise byte values of changes of the reference data to be performed according to the opcodes; and the third stream comprises patterns of subsequent payload bytes of changes to be performed, and the operands and the instructions are designed for updating the reference data upon processing the update data at a processor;

compressing the provided update data;

transmitting the compressed update data to the processor;

decompressing at the processor the compressed update data; and interpreting at the processor the decompressed update data and updating the reference data by the processor, according to the interpreted update data.

10. A terminal comprising:

a processor; and a memory with computer executable program code stored therein for implementing a method of updating reference data stored in the memory when executed by the processor, the method comprising:

providing update data structured according to a partitioned data structure, wherein:

the data structure comprises first, second and third partitioned streams of data, wherein:

the first stream, named an opcode stream, comprises patterns of instructions to the processor and addresses of where changes have to be performed in said reference data, each address being a relative address coded as the difference from a last address of change in the update data, wherein the instructions are opcodes;

the second stream comprises patterns of operands of the instructions, comprising a first payload of changes of the reference data to be performed, wherein the operands comprise byte values of changes of the reference data to be performed according to the opcodes; and the third stream comprises patterns of subsequent payloads of changes to be performed; and the operands and the instructions are designed for updating the reference data upon processing the update data at the processor;

compressing the provided update data;

transmitting the compressed update data to the processor;

decompressing at the processor the compressed update data; and interpreting at the processor the decompressed update data and updating the reference data by the processor, according to the interpreted update data.

11. The terminal according to claim 10, the terminal being a payment terminal or electronic funds transfer at point of sale.

12. The terminal according to claim 10, wherein said opcodes comprise:

at least one opcode designed for single-byte changes; and opcodes designed for multi-byte change.

13. The terminal according to claim 12, wherein:

said opcodes are encoded in 4-bits.

14. The terminal according to claim 12, wherein:

said at least one opcode designed for single-byte changes is an implicit opcode.

15. The terminal according to claim 10, wherein:

one of the opcodes is a forced base-page change opcode, designed for incrementing a current base-page.

16. The terminal according to claim 10, wherein:

at least one of the opcodes is an inheritance opcode.

17. The terminal according to claim 10, wherein:

the opcodes comprise seventeen different opcodes, including an implicit opcode.

18. The terminal according to claim 10, wherein said update data are provided in one file.

* * * * *

UNITED STATES PATENT AND TRADEMARK OFFICE
CERTIFICATE OF CORRECTION

| | | |
|---|---|---|
| PATENT NO. | : 8,615,754 B2 | Page 1 of 1 |
| APPLICATION NO. | : 12/034151 | |
| DATED | : December 24, 2013 | |
| INVENTOR(S) | : William R. R. Reid | |

It is certified that error appears in the above-identified patent and that said Letters Patent is hereby corrected as shown below:

Title Page

(56) References Cited

OTHER PUBLICATIONS

Line 7, delete "Jun. 2006" and insert --Jun. 2002--

Signed and Sealed this
Second Day of February, 2016

Michelle K. Lee
*Director of the United States Patent and Trademark Office*